United States Patent
Kim et al.

(10) Patent No.: US 8,277,738 B2
(45) Date of Patent: Oct. 2, 2012

(54) MOBILE TYPE ELECTRON ACCELERATOR

(75) Inventors: Sung Myun Kim, Daejeon (KR); Won Gu Kang, Daejeon (KR); Jin Kyu Kim, Daejeon (KR); Bum Soo Han, Daejeon (KR); Heung Gyu Park, Daejeon (KR); Sung Han Kuk, Daejeon (KR); Yu Ri Kim, Gyeryong-si (KR)

(73) Assignee: EB-Tech Co., Ltd., Yuseong-gu, Daejeon (KR)

( * ) Notice: Subject to any disclaimer, the term of this patent is extended or adjusted under 35 U.S.C. 154(b) by 230 days.

(21) Appl. No.: 12/815,497

(22) Filed: Jun. 15, 2010

(65) Prior Publication Data

US 2011/0052455 A1    Mar. 3, 2011

(30) Foreign Application Priority Data

Aug. 27, 2009    (KR) .................. 10-2009-0079591

(51) Int. Cl.
  *B01J 19/08*    (2006.01)
  *H01J 37/04*    (2006.01)

(52) U.S. Cl. .................. 422/186; 250/492.3
(58) Field of Classification Search .............. 422/186; 250/492.3
  See application file for complete search history.

(56) References Cited

U.S. PATENT DOCUMENTS

| 4,446,374 A * | 5/1984 | Ivanov et al. ............ 250/492.3 |
| 5,744,811 A * | 4/1998 | Schonberg et al. ...... 250/492.3 |
| 7,626,186 B2 * | 12/2009 | Kang et al. ................ 250/492.3 |

* cited by examiner

*Primary Examiner* — Kishor Mayekar
(74) *Attorney, Agent, or Firm* — WRB-IP LLP

(57) ABSTRACT

Disclosed is a mobile type electron accelerator which enables a high voltage generator and a beam extraction device irradiating electron beams, and a reactor to be safely placed in containers mounted on trailers of a vehicle having mobility so as to allow a sample (for example, waste water, waste gas, and a sample to be investigated) to be tested in real time while maximally suppressing danger of environmental pollution or radiation exposure, thereby assuring rapidity, field applicability, and accuracy.

13 Claims, 19 Drawing Sheets

MOBILE TYPE ELECTRON ACCELERATOR

BACKGROUND AND SUMMARY

The present invention relates to a mobile type electron accelerator, and more particularly to a mobile type electron accelerator which enables a high voltage generator and a beam extraction device irradiating electron beams, and a reactor to be safely placed in containers mounted on trailers of a vehicle having mobility so as to allow a sample (for example, waste water, waste gas, and a sample to be investigated) to be tested in real time while maximally suppressing danger of environmental pollution or radiation exposure.

In general, an electron accelerator refers to an apparatus which accelerates electrons generated from an electron gun through a high voltage generator, and diffuses the electrons so as to emit electron beams having high energy close to the speed of light through a beam extraction device in a vacuum condition.

That is, the electron accelerator accelerates the electrons generated from the electron gun through high voltage from primary and secondary coils of the high voltage generator, and emits the electron beams having a regular width while scanning in a scan coil in the beam extraction device so as to irradiate the electron beams to a target object.

FIG. 1 is a view illustrating a structure of a conventional electron accelerator.

Conventionally, a high voltage generator 10 accelerates electrons generated from an electron gun (not shown) under the condition that the electron gun is driven at a high negative voltage and the lower end of the high voltage generator 10 is located at a ground potential, and the electrons accelerated due to a potential difference between primary and secondary coils reach a target object via the high voltage generator 10 and a beam extraction device 20, as shown in FIG. 1.

Such an electron accelerator is widely applied to various fields, including the field of environment, such as a waste water treatment, waste gas purification, and sludge treatment, the fields of chemistry/fiber, such as manufacture of flame-retardant wires, manufacture of heat shrinkable tubes, manufacture of synthetic leather, and manufacture of tires, the fields of medicine/food, such as sterilization of food and medical supplies, curing of paints, surface treatment of semiconductors and metals, and manufacture of ceramics.

For example, an electron beam sterilization technique is applied as a sterilization method to induce radiation decomposition of waste water using electron beams and to eradicate germs, such as bacteria, viruses, and parasites present in sewage sludge through various radical reactions generated thereby.

According, the applicant of the present invention proposes a mobile type electron accelerator using electron beams in real time on various spots.

It is desirable to provide a mobile type electron accelerator which enables a high voltage generator and a beam extraction device irradiating electron beams, and a reactor to be safely placed in containers mounted on trailers of a vehicle having mobility so as to allow a sample (for example, waste water, waste gas, and a sample to be investigated) to be tested in real time while maximally suppressing danger of environmental pollution or radiation exposure, thereby assuring rapidity, field applicability, and accuracy.

It is desirable to provide a mobile type electron accelerator which emits electron beams accelerated by a high voltage generator to a reactor disposed in a radiation shielding room so as to prevent radiation leakage.

It is desirable to provide a mobile type electron accelerator which compensates for electron beam energy through a beam catcher disposed in a reactor so as to prevent corrosion of containers or trailers or thermal damage thereto and thus to secure lifespan of the containers or the trailers.

It is desirable to provide a mobile type electron accelerator which prevents damage to a radiation shielding room and containers due to electron beam energy of a beam extraction device through a beam catcher using cooling water supplied from a chiller.

It is desirable to provide a mobile type electron accelerator which absorbs ozone generated from a reactor in a sealed radiation shielding room through an ozone absorber and discharges the absorbed ozone to the outside so as to prevent air pollution.

It is desirable to provide a mobile type electron accelerator which secures protection from radiation exposure.

It is desirable to provide a mobile type electron accelerator which maximally compensates for radiation leakage to the outside through an inner channel, a pipe hole, and an outer channel, formed like a labyrinthine, when various cables or pipes are connected to a radiation shielding room.

It is desirable to provide a mobile type electron accelerator which enables a sliding door to be opened and closed using a hydraulic cylinder (or an electric motor with gears) controlled by a controller so as to safely protect a worker from danger of radiation exposure from a radiation shielding room, and particularly minimizes external influence (spatial influence) through the sliding door opened and closed in the right and left direction in the sliding manner.

It is desirable to provide a mobile type electron accelerator which enables a sliding door to slidably open and close a hole formed through the ceiling of a container so as to enable greater ease in assembly and disassembly of a high voltage generator with and from a radiation shielding room while locating the high voltage generator above the radiation shielding room.

It is desirable to provide a mobile type electron accelerator which enables a cap of a high voltage generator to simply slide so as to overcome the limitations of a container having a narrow space.

It is desirable to provide a mobile type electron accelerator which rapidly, simply, accurately, and freely assembles and disassembles a cap having a considerable weight with and from a high voltage container without separate equipment, such as a crane.

In accordance with an aspect of the present invention, a mobile type electron accelerator is provided including a container mounted on a trailer, a radiation shielding room disposed within the container and provided with a door set, a high voltage generator installed above the radiation shielding room to accelerate electron beams, a beam extraction device installed under the high voltage generator to diffuse and emit the electron beams to the inside of the radiation shielding room in a vacuum condition, a reactor placed below the beam extraction device, a beam catcher disposed in the reactor, a chiller to cool the high voltage generator, the beam extraction device, and the beam catcher, a gas supply to supply insulation gas to the high voltage generator, a power supply to supply power to the high voltage generator, an ozone absorber to absorb ozone generated from the reactor and then to discharge the ozone to the outside, and a controller to operate the ozone absorber while controlling the power supply to emit the electron beams from the high voltage generator to the beam extraction device and controlling the chiller to cool the high voltage generator, the beam extraction device, and the beam catcher.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a mobile type electron accelerator in accordance with a preferred embodiment of the present invention will be described with reference to the accompanying drawings. A plurality of embodiments of the present invention may be possible, and the objects, features and advantages of the present invention may be more clearly understood from these embodiments.

Figure 1:
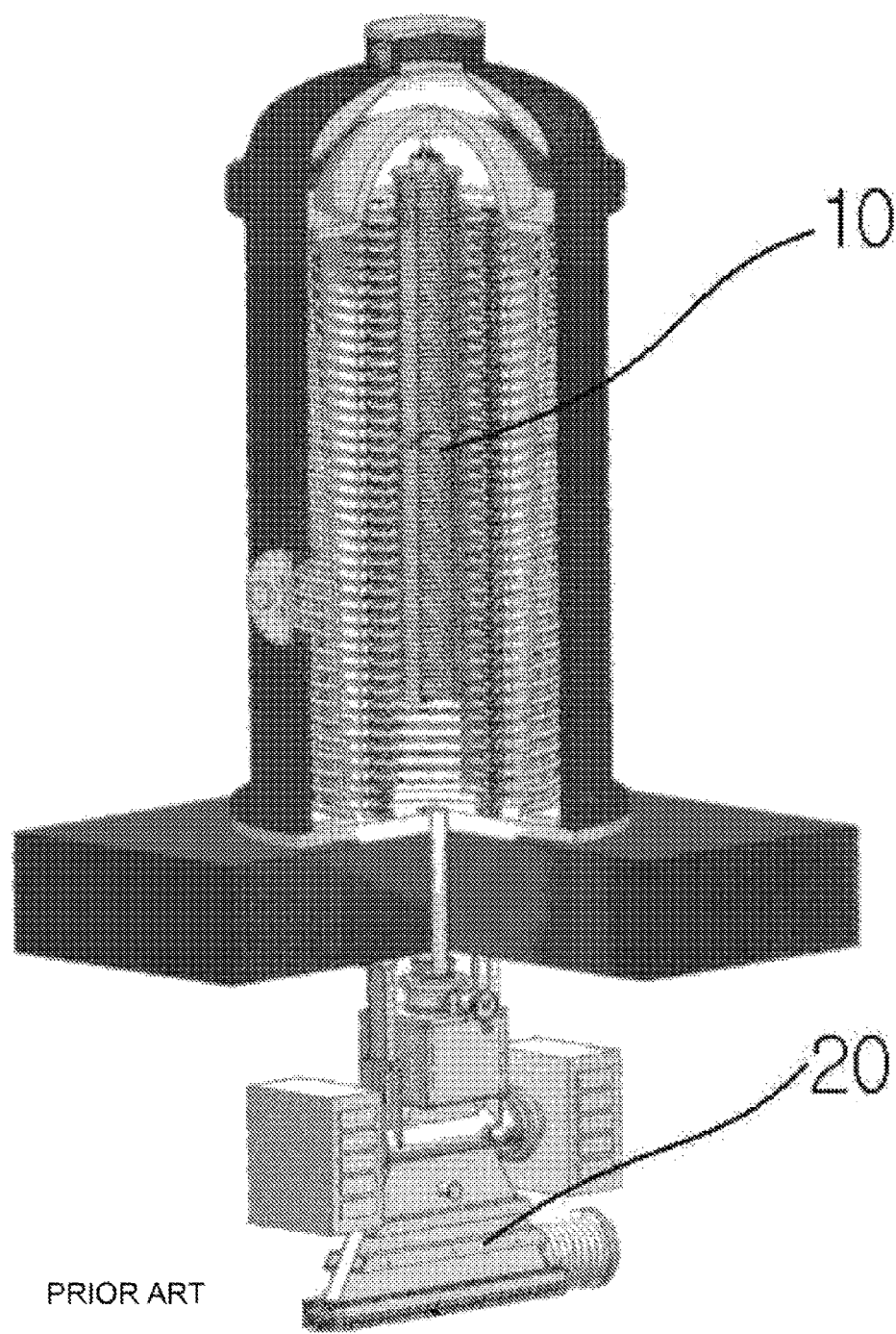
FIG. 1 is a view illustrating a structure of a conventional electron accelerator.
Figure 2:
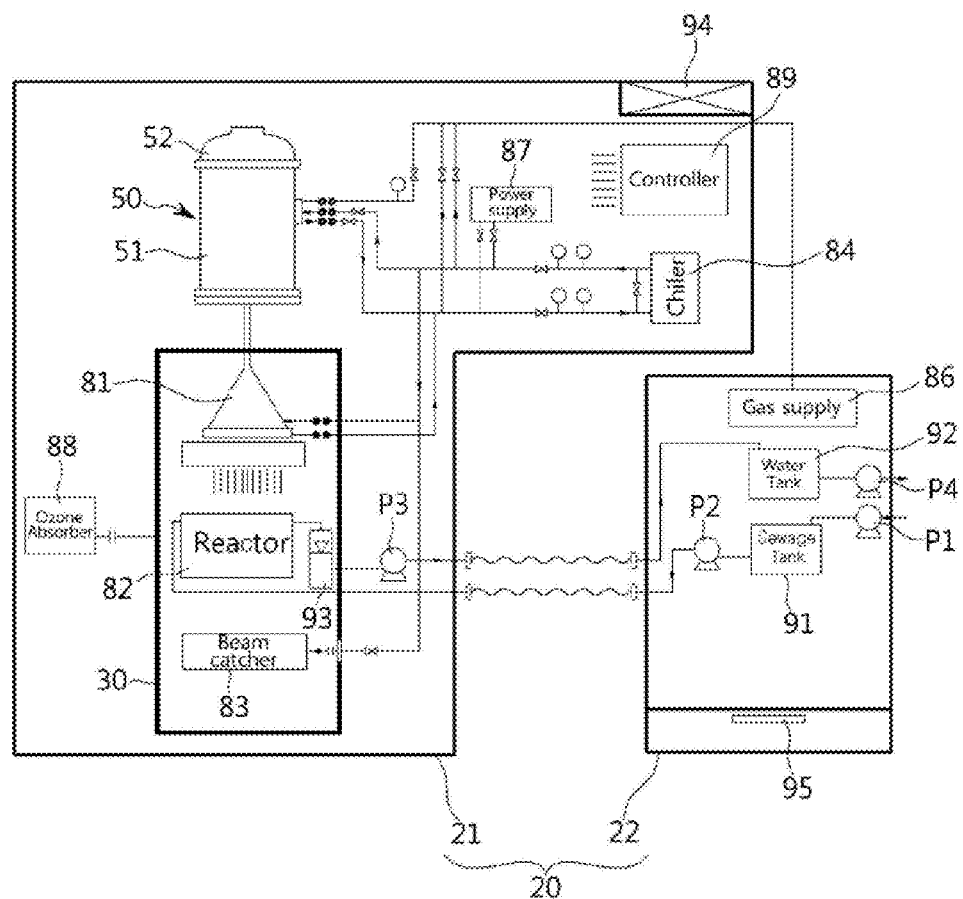
FIG. 2 is a schematic view illustrating an overall structure of a mobile type electron accelerator in accordance with the present invention.
Figure 3A:
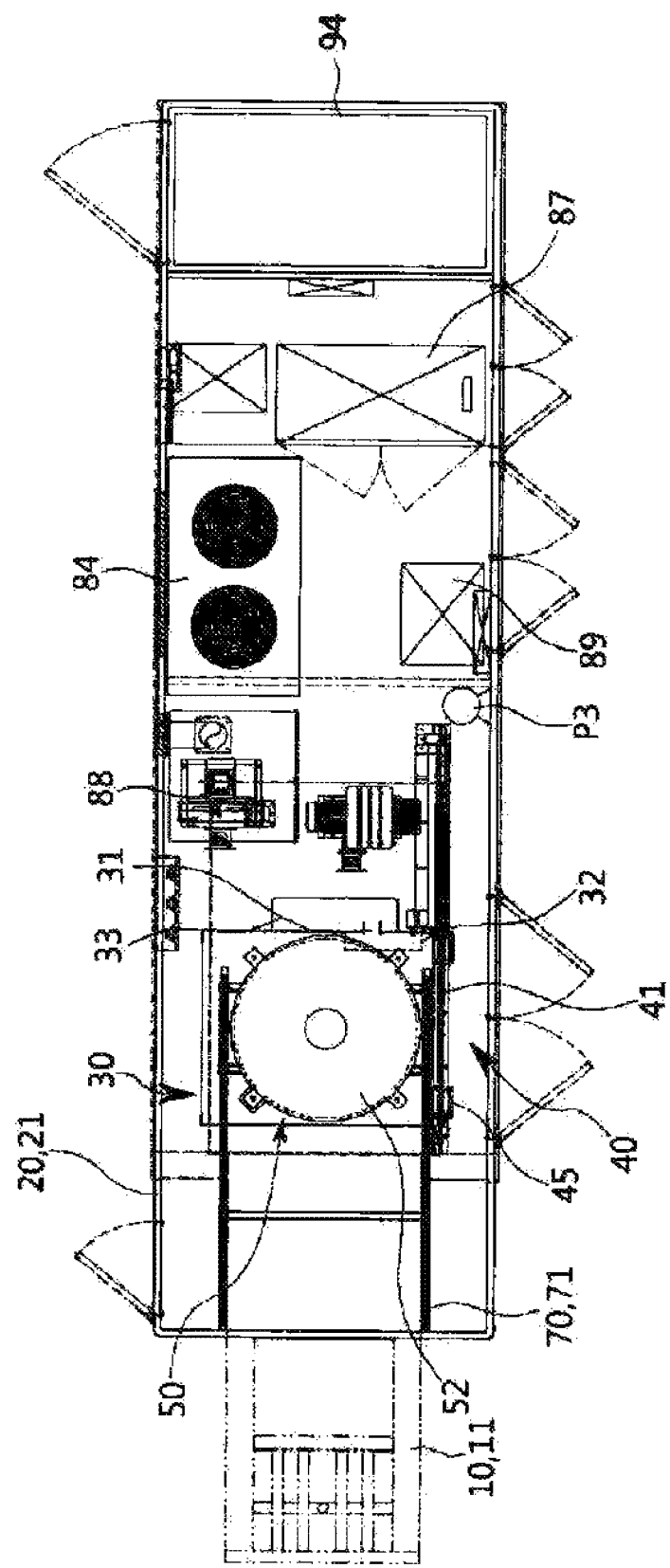
FIG. 3A is a plan view illustrating a structure of a main container applied to the mobile type electron accelerator in accordance with the present invention.
Figure 3B:
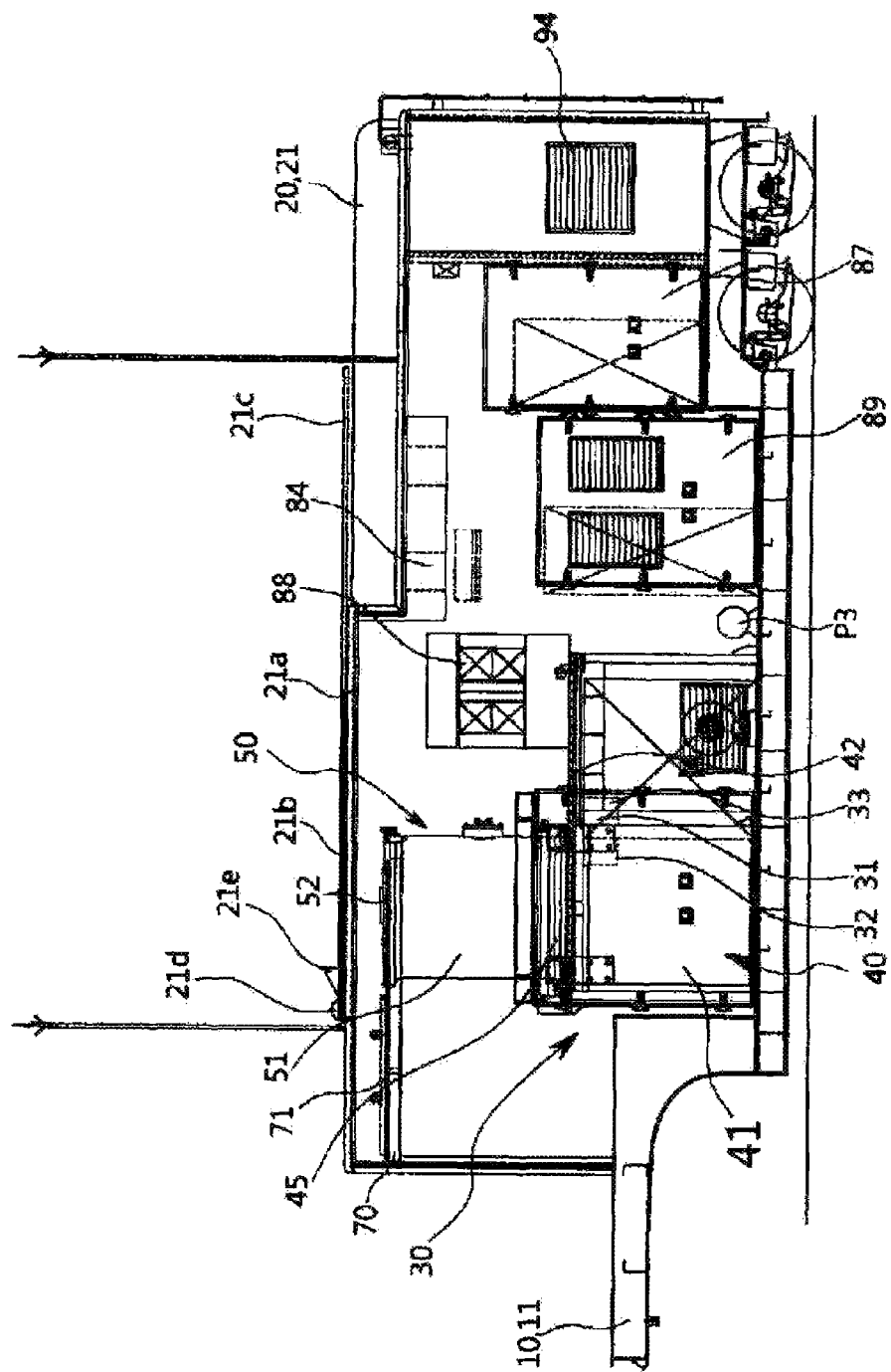
FIG. 3B is a plan view illustrating structures of a main trailer and the main container applied to the mobile type electron accelerator in accordance with the present invention.
Figure 4A:
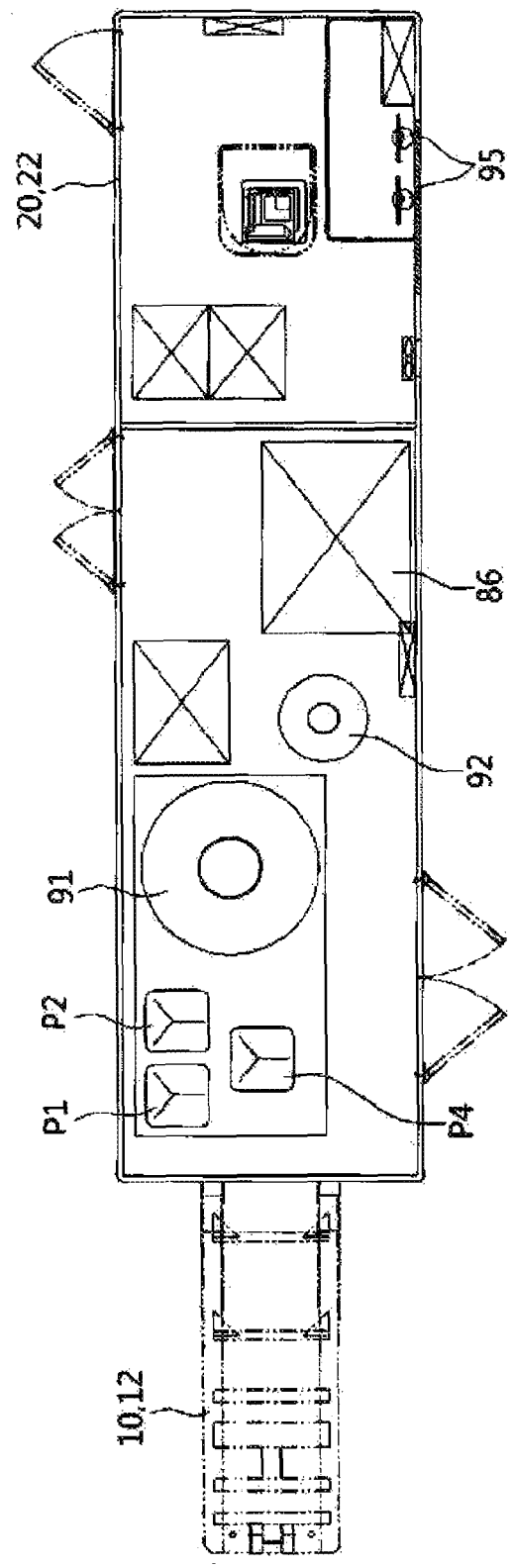
FIG. 4A is a plan view illustrating a structure of a sub container applied to the mobile type electron accelerator in accordance with the present invention.
Figure 4B:
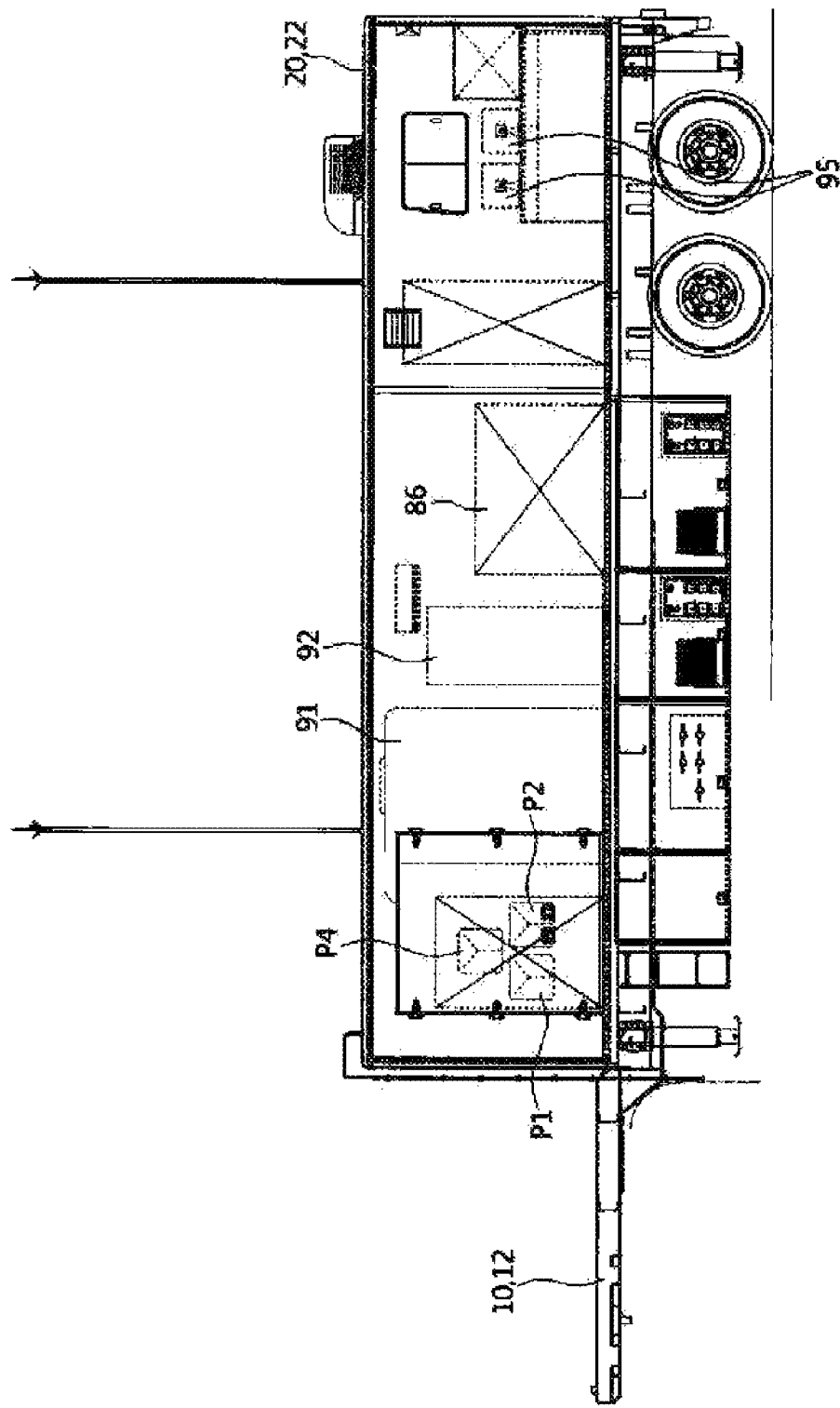
FIG. 4B is a plan view illustrating structures of a sub trailer and the sub container applied to the mobile type electron accelerator in accordance with the present invention.

FIG. 2 is a schematic view illustrating an overall structure of a mobile type electron accelerator in accordance with the present invention, FIG. 3A is a plan view illustrating a structure of a main container applied to the mobile type electron accelerator in accordance with the present invention, FIG. 3B is a plan view illustrating structures of a main trailer and the main container applied to the mobile type electron accelerator in accordance with the present invention, FIG. 4A is a plan view illustrating a structure of a sub container applied to the mobile type electron accelerator in accordance with the present invention, and FIG. 4B is a plan view illustrating structures of a sub trailer and the sub container applied to the mobile type electron accelerator in accordance with the present invention.

The mobile type electron accelerator in accordance with the present invention, as shown in FIGS. 2 to 4B, includes a container 20 mounted on a trailer 10, a radiation shielding room 30 provided in the container 20 and having a door set 40, a high voltage generator 50 installed above the radiation shielding room 30 to accelerate electron beams, a beam extraction device 81 provided under the high voltage generator 50 to diffuse and emit the electron beams toward the radiation shielding room 30 in a vacuum condition, a reactor 82 located below the beam extraction device 81, a beam catcher 83 disposed in the reactor 82, a chiller 84 to cool the high voltage generator 50, the beam extraction device 81, and the beam catcher 83, a gas supply 86 to supply insulation gas to the high voltage generator 50, a power supply 87 to supply power to the high voltage generator 50, an ozone absorber 88 to absorb ozone generated from the reactor 82 and the discharged the absorbed ozone, and a controller 89 to operate the ozone absorber 88 while controlling the power supply 87 to emit the electron beams from the high voltage generator 50 to the beam extraction device 81 and controlling the chiller 84 to cool the high voltage generator 50, the beam extraction device 81, and the beam catcher 83.

The electron beams accelerated by the high voltage generator 50 are emitted to the reactor 82 disposed in the radiation shielding room 30, thereby preventing radiation leakage. Particularly, electron beam energy is compensated for by the beam catcher 83 disposed in the reactor, thereby preventing corrosion of a container 20 and a trailer 10 or thermal damage thereto and thus assuring lifespan of the container 20 and the trailer 10. Here, the beam catcher 83 serves to lower the high electron beam energy using cooling water supplied from the chiller 84.

The ozone absorber 88 absorbs ozone generated from the reactor 82 within the sealed radiation shielding room 30 and discharges the absorbed ozone to the outside, thereby preventing air pollution.

As described above, the mobile type electron accelerator in accordance with the present invention enables the high voltage generator 50 and the beam extraction device 81 irradiating electron beams, and the reactor 82 to be safely placed in the container 20 mounted on the trailer 10 of a vehicle having mobility so as to allow a sample (for example, waste water, waste gas, and a sample to be investigated) to be tested in real time while maximally suppressing danger of environmental pollution or radiation exposure, thereby assuring rapidity, field applicability, and accuracy.

More specifically, the mobile type electron accelerator in accordance with the present invention further includes a sewage tank 91 to supply sewage to the reactor 82, a reaction water tank 92 to receive water obtained by reaction in the reactor 82 by the electron beams of the beam extraction device 81, and a reaction water tub 93 to receive water obtained by reaction in the reactor 82.

Therefore, the mobile type electron accelerator in accordance with the present invention supplies a sample on site, for example, sewage from the sewage tank 91 to the reactor 82, and then supplies water, obtained by reaction in the reactor 82 by the electron beams of the beam extraction device 81, to the reaction water tank 92, thus being capable of collectively treating the sewage in the container 20. The mobile type electron accelerator in accordance with the present invention further includes a first pump P1 to supply sewage from the outside to the sewage tank 91, a second pump P2 to supply the sewage from the sewage tank 91 to the reactor 82, a third pump P3 to supply the water, obtained by reaction, from the reaction water tub 93 to the reaction water tank 92, and a fourth pump P4 to discharge the water, obtained by reaction, from the reaction water tank 92 to the outside, thereby being capable of automating a flow of the sewage.

Figure 5A:
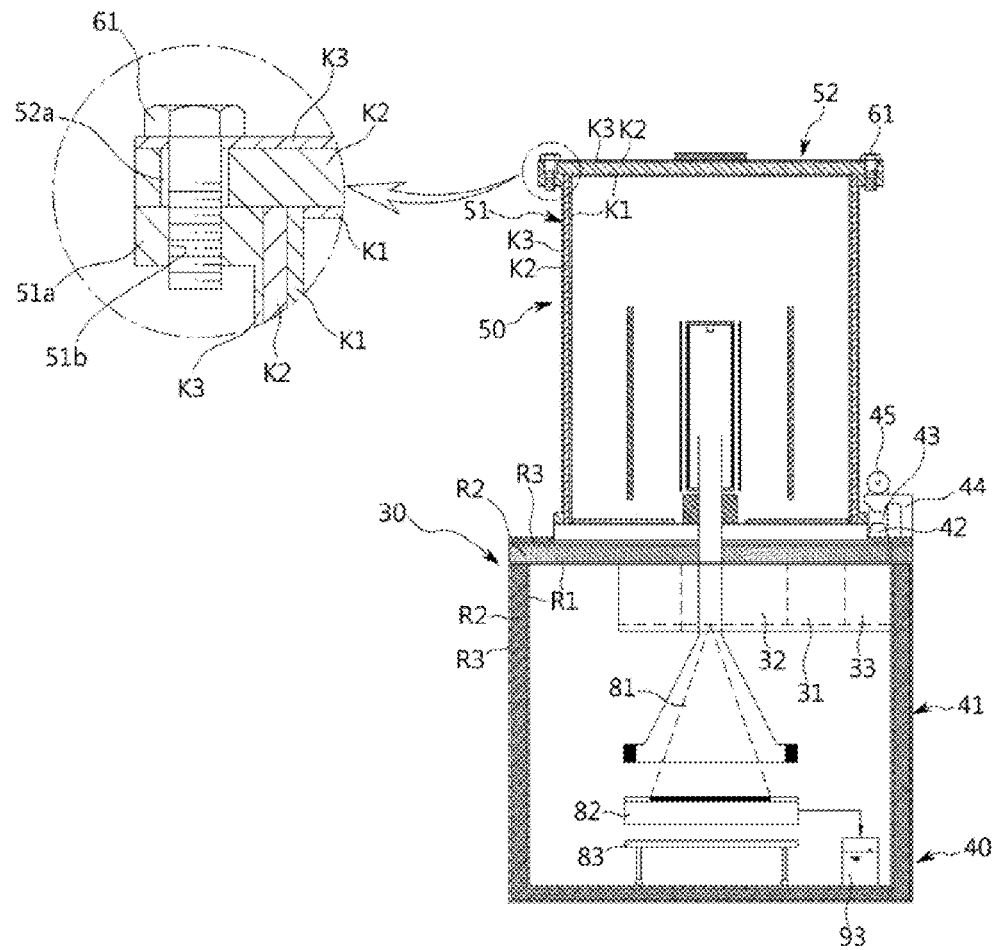
FIGS. 5A and 5B are schematic sectional views of a high voltage generator, a beam extraction device, and a radiation shielding room applied to the mobile type electron accelerator in accordance with the present invention, at different angles.
Figure 5B:
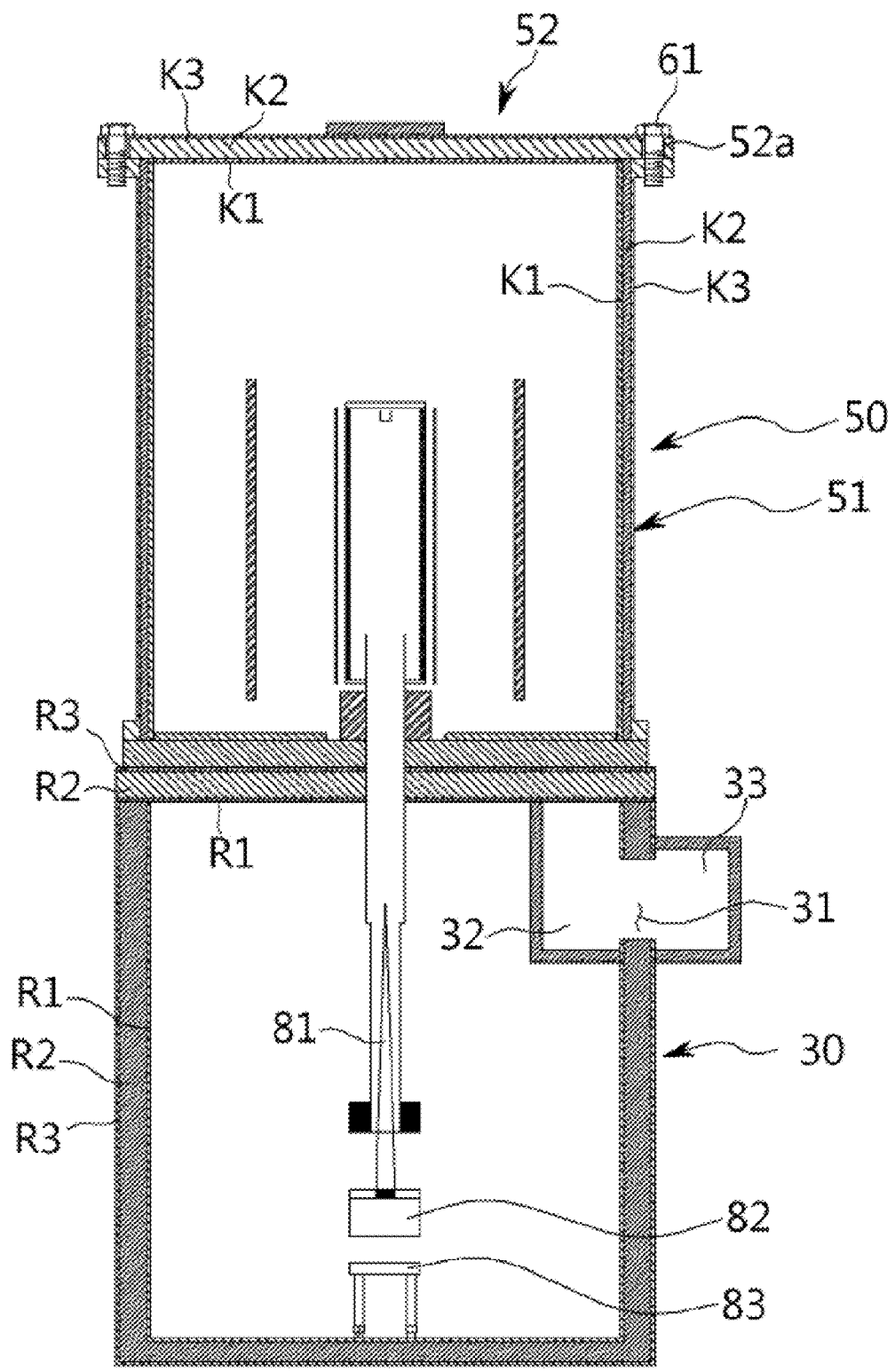
Figure 5C:
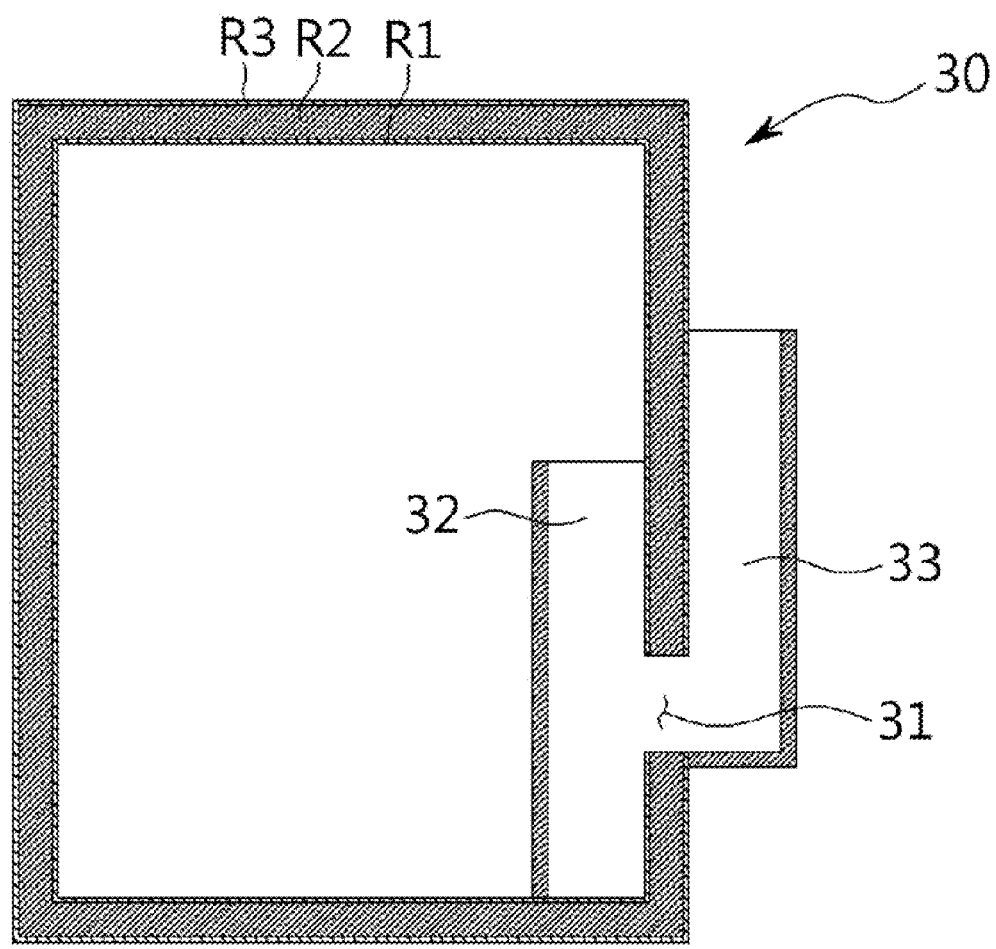
FIG. 5C is a schematic transversal-sectional view of the radiation shielding room applied to the mobile type electron accelerator in accordance with the present invention.

FIGS. 5A and 5B are schematic sectional views of the high voltage generator, the beam extraction device, and the radiation shielding room applied to the mobile type electron accelerator in accordance with the present invention, at different angles, and FIG. 5C is a schematic transversal-sectional view of the radiation shielding room applied to the mobile type electron accelerator in accordance with the present invention.

As shown in FIGS. 5A to 5C, each of the radiation shielding room 30 and the door set 40 applied to the mobile type electron accelerator in accordance with the present invention is formed of a steel inner wall R1, a lead intermediate wall R2, and a steel outer wall R3.

The mobile type electron accelerator is designed such that it irradiates electron beams in real time on site due to the nature thereof. Therefore, in order to firmly secure radiation exposure safety as much as possible, a part of the electron accelerator irradiating radiation to the reactor 82 is disposed within the radiation shielding room 30 and the door set 40, and each of the radiation shielding room 30 and the door set 40 is formed of the steel inner wall R1 and the steel outer wall R3 having a high strength stacked on both surfaces of the lead intermediate wall R2 completely preventing radiation leakage, thereby simultaneously assuring solidity and safety.

Here, a pipe hole 31 is formed through the radiation shielding room 30, and an inner channel 32 formed on the steel inner wall R1 and perpendicularly connected to the pipe hole 31 and an outer channel 33 formed on the steel outer wall R3, perpendicularly connected to the pipe hole 31, and disposed in parallel with the inner channel 32 are provided. When various cables or pipes are connected to the radiation shielding room 30, radiation leakage to the outside is maximally compensated for by the inner channel 32, the pipe hole 31, and the outer channel 33, formed like a labyrinthine.

Figure 6A:
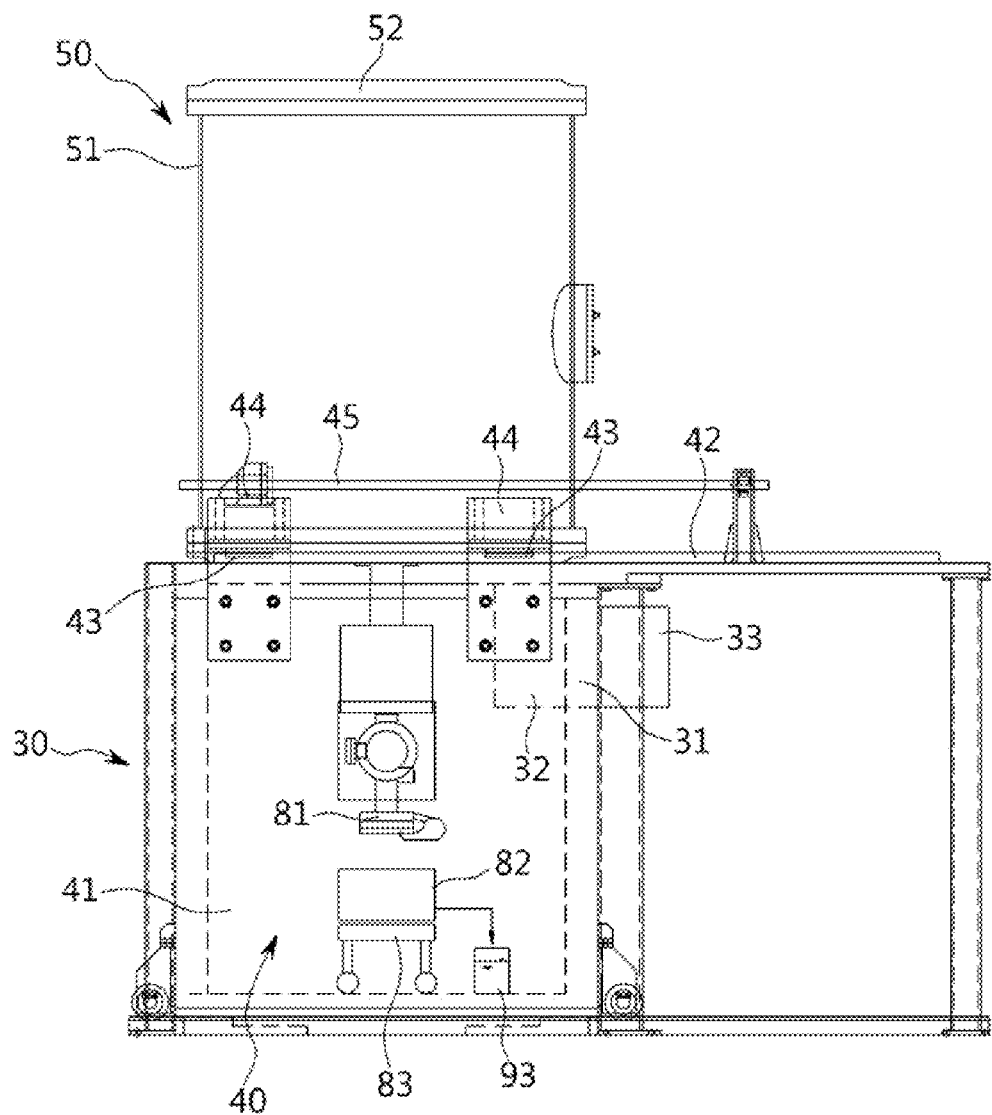
FIGS. 6A to 6C are schematic sectional views of the radiation shielding room, a door set, and the high voltage generator applied to the mobile type electron accelerator in accordance with the present invention, at different angles.
Figure 6B:
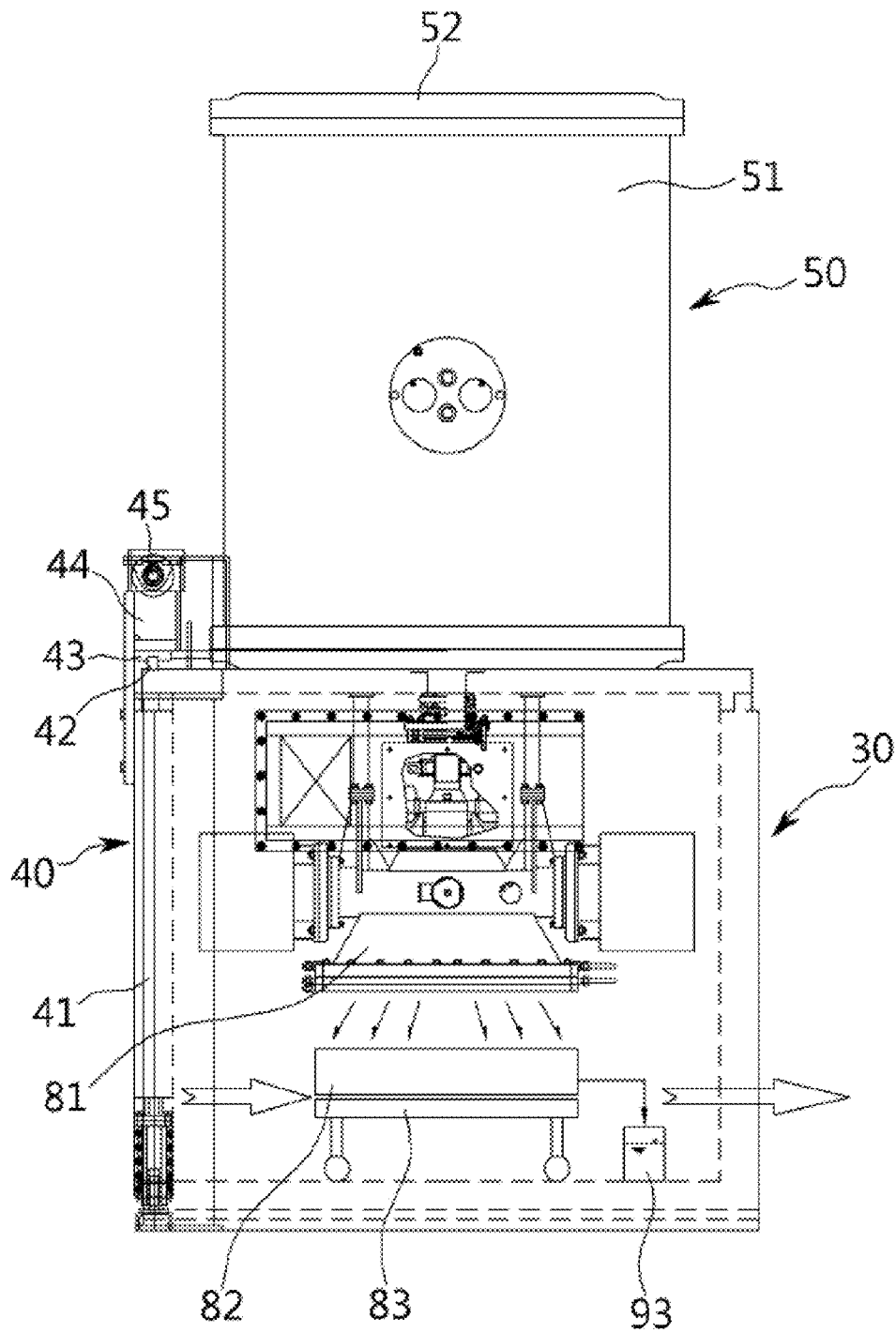
Figure 6C:
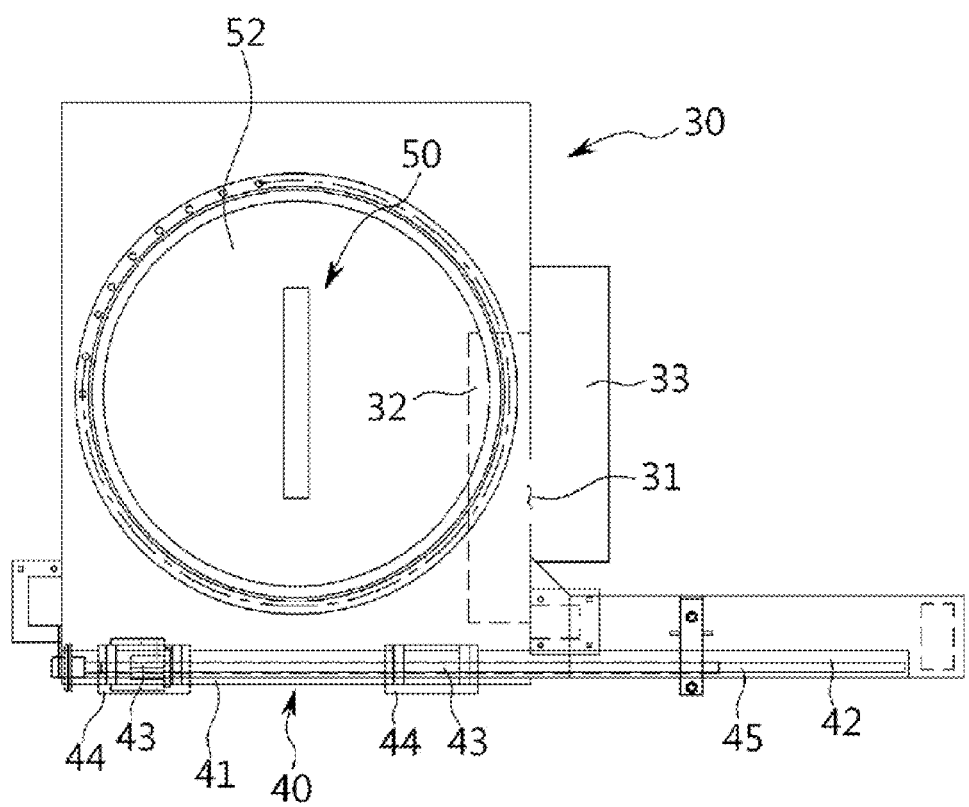

FIGS. 6A to 6C are schematic sectional views of the radiation shielding room, the door set, and the high voltage generator applied to the mobile type electron accelerator in accordance with the present invention, at different angles.

As shown in FIGS. 6A to 6C, the door set 40 applied to the mobile type electron accelerator in accordance with the present invention includes a sliding door 41 to slidably open and close the radiation shielding room 30, a door rail 42 disposed in the longitudinal direction on the steel outer wall R3, door rollers 43 mounted on the door rail 42, door brackets 44 to connect the door rollers 43 to the sliding door 41, and a hydraulic cylinder (or an electric motor with gears) 45 to reciprocate the door rollers 43 fixed to the door brackets 44 along the door rail 42 under the control of the controller 89.

The mobile type electron accelerator in accordance with the present invention enables the sliding door 41 to be slidably opened and closed through the hydraulic cylinder (or the electric motor with gears) 45 controlled by the controller 89, thereby allowing a worker to be safely protected from danger of radiation exposure from the radiation shielding room 30. Particularly, the sliding door 41 which is opened and closed in the right and left direction in the sliding manner minimizes external influence (due to heavy weight of the sliding door 41 formed of the lead intermediate wall R2 and the steel inner and outer walls R1 and R3, and spatial influence in case of a hinged door).

Figure 7A:
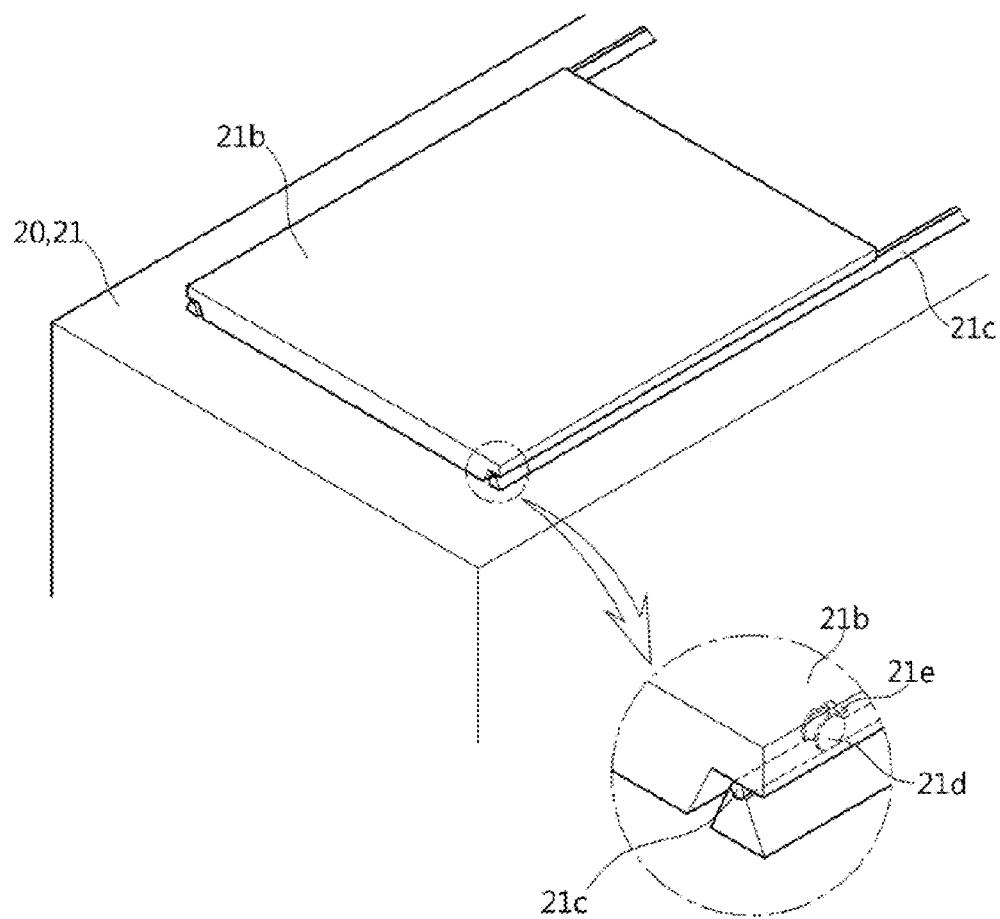
FIGS. 7A and 7B are perspective views illustrating a sliding door to open and close a hole of the container applied to the mobile type electron accelerator in accordance with the present invention.
Figure 7B:
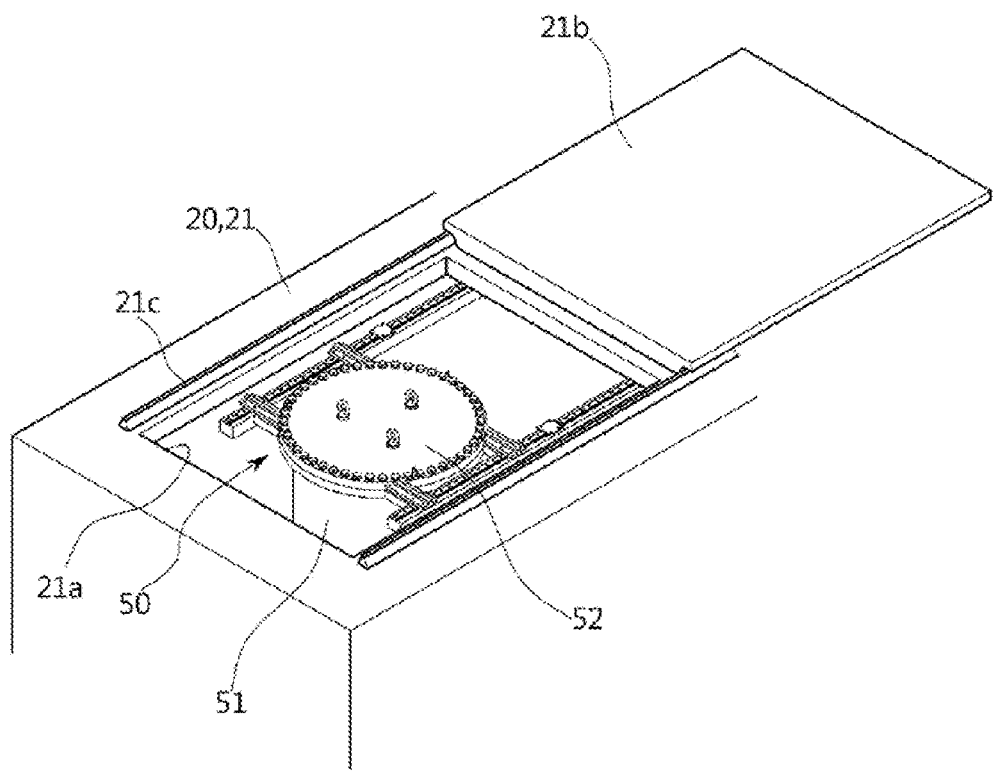

FIGS. 7A and 7B are perspective views illustrating a sliding door to open and close a hole of the container applied to the mobile type electron accelerator in accordance with the present invention.

As shown in FIGS. 7A and 7B, the mobile type electron accelerator in accordance with the present invention further includes a hole 21a formed through the ceiling of the container 20 toward the high voltage generator 50, a sliding door 21b to open and close the hole 21a, ceiling rails 21c disposed in the longitudinal direction at both sides of the hole 21a, ceiling rollers 21d mounted on the ceiling rails 21c, and ceiling brackets 21e to connect the ceiling rollers 21d to the sliding door 21b.

The hole 21a is formed through the ceiling of the container 20, and the sliding door 21b slides along the ceiling rails 21c and opens and closes the hole 21a, thereby facilitating assembly or disassembly of the high voltage generator 50, located above the radiation shielding room 30, with or from the radiation shielding room 30.

Figure 8A:
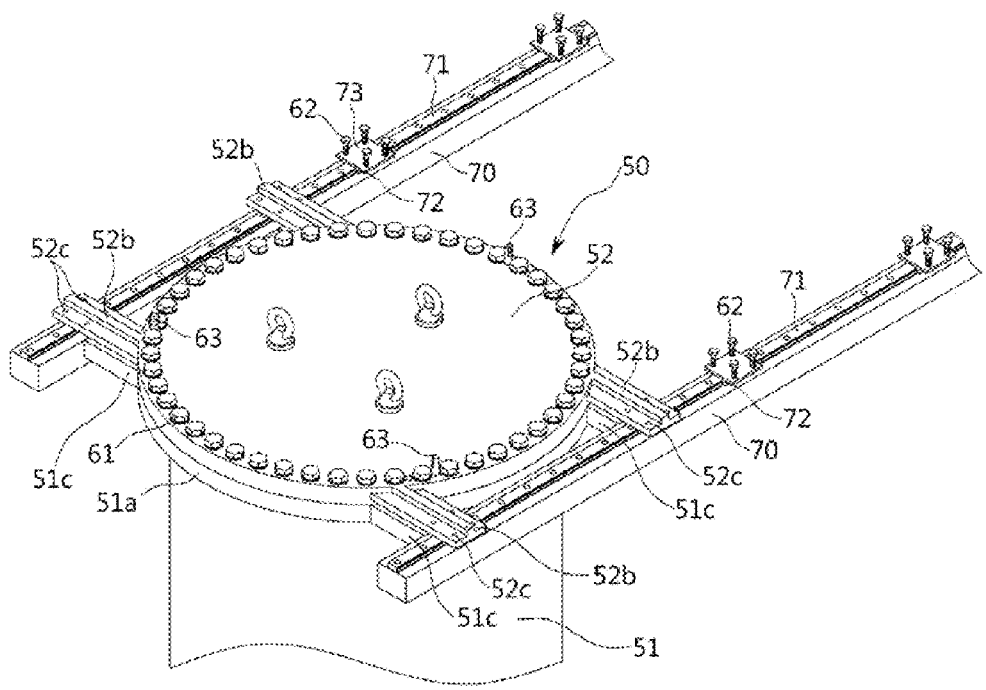
FIGS. 8A and 8B are assembled and exploded perspective views illustrating cap rails including the high voltage generator applied to the mobile type electron accelerator in accordance with the present invention.
Figure 8B:
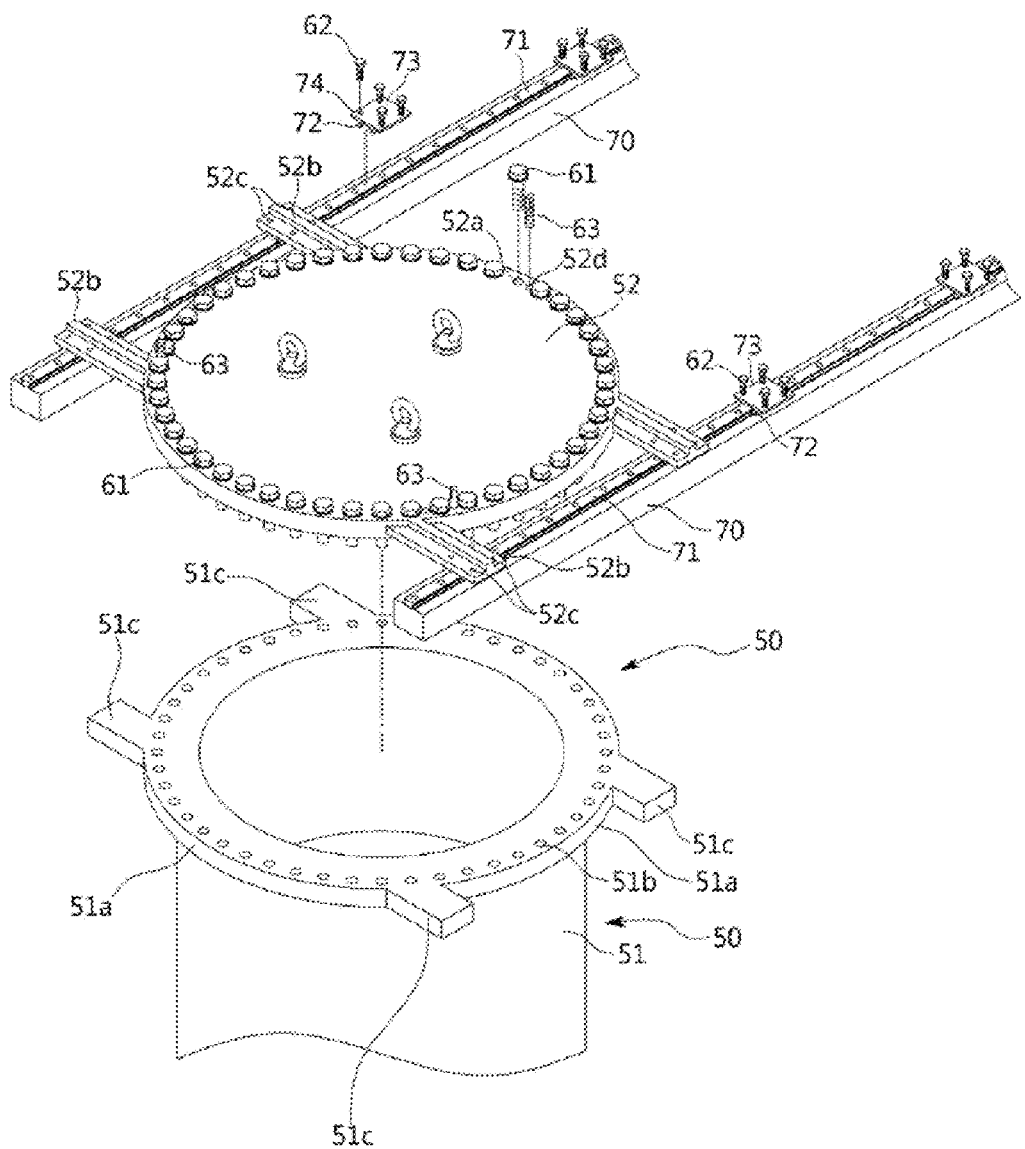
Figure 9A:
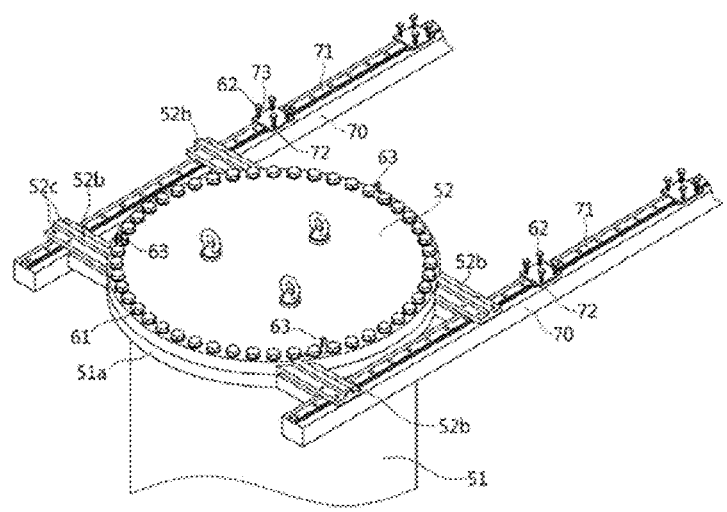
FIGS. 9A to 9E are perspective views illustrating a disassembly process of a cap of the high voltage generator applied to the mobile type electron accelerator in accordance with the present invention.
Figure 9B:
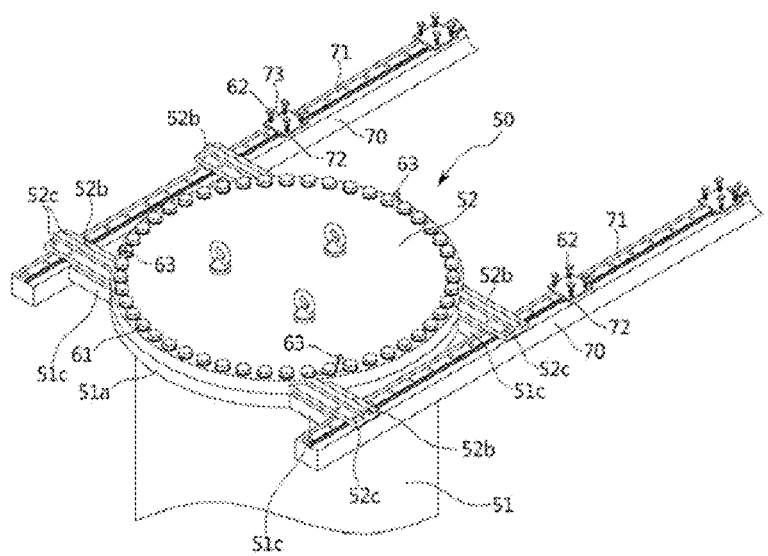
Figure 9C:
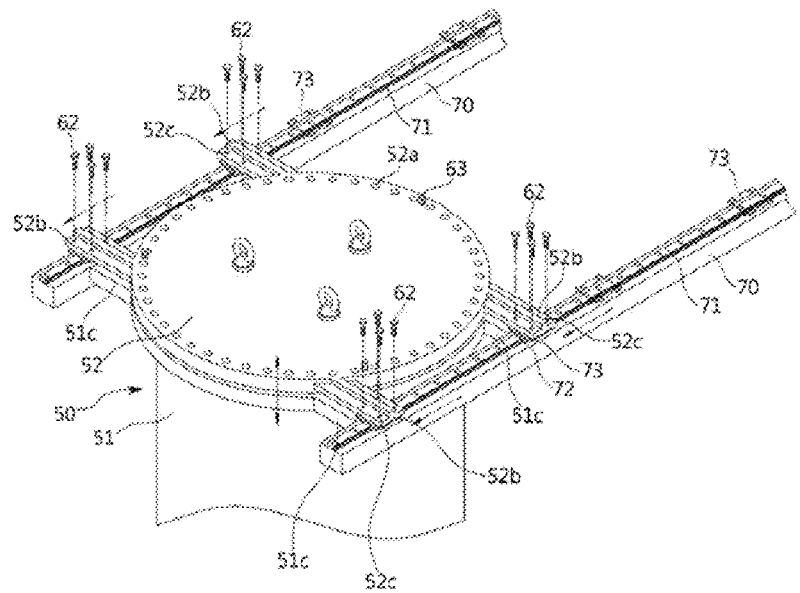
Figure 9D:
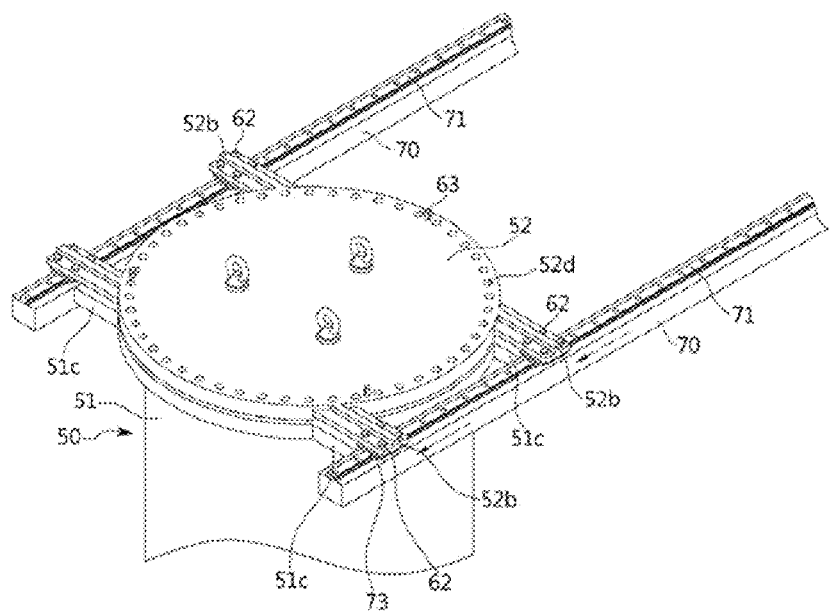
Figure 9E:
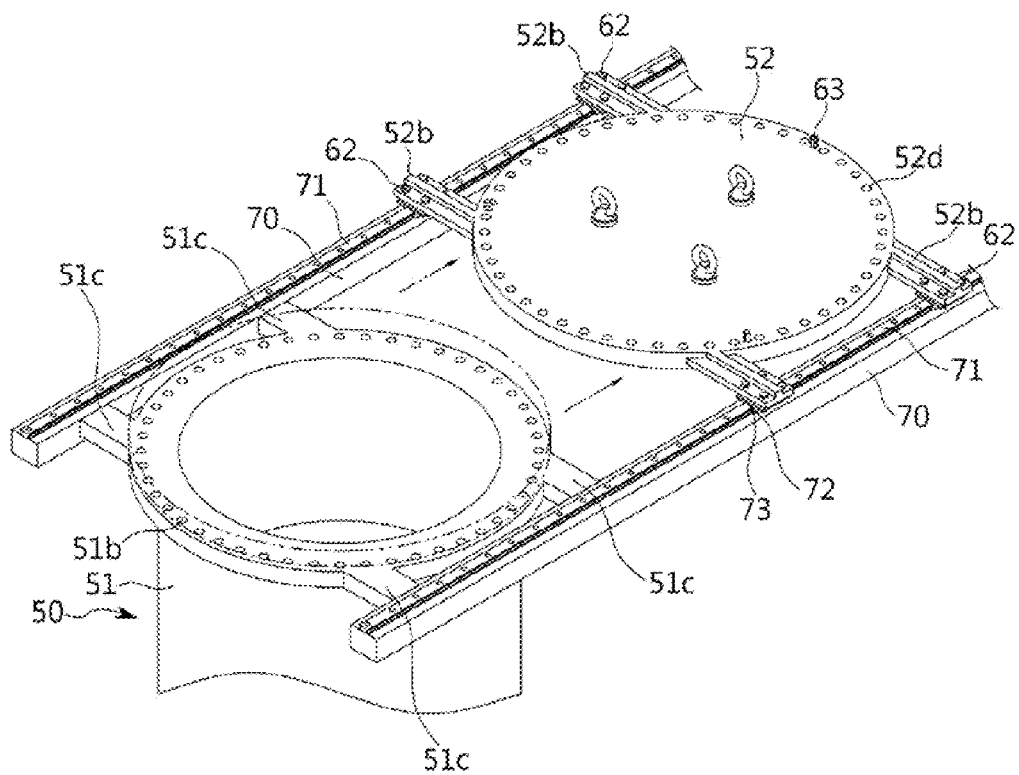

FIGS. 8A and 8B are assembled and exploded perspective views illustrating cap rails including the high voltage generator applied to the mobile type electron accelerator in accordance with the present invention.

As shown in FIGS. 8A and 8B, the high voltage generator 50 applied to the mobile type electron accelerator in accordance with the present invention includes a high pressure vessel 51, in which primary and secondary coils (not shown) are placed, provided with screw holes 51b formed through an upper rim 51a, a cap 52 provided with through holes 52a coinciding with the screw holes 51b and covering the high pressure vessel 51, and fixing bolts 61 connected to the screw holes 51b via the through holes 52a. Here, each of the high pressure vessel 51 and the cap 52 is formed of a steel inner wall K1, a lead intermediate wall K2, and a steel outer wall K3, as shown in FIGS. 5A and 5B.

The high voltage generator 50 is disassembled into the high pressure vessel 51 and the cap 52 such that the high voltage generator 50 may be easily repaired in the event of malfunction. Further, in order to completely block radiation leaked from the high voltage generator 50, the steel inner wall K1 and the steel outer wall K3 having a high strength are stacked on both surfaces of the lead intermediate wall K2, thereby simultaneously assuring solidity and safety.

FIGS. 9A to 9E are perspective views illustrating a disassembly process of the cap of the high voltage generator applied to the mobile type electron accelerator in accordance with the present invention.

As shown in FIGS. 9A to 9E, the mobile type electron accelerator in accordance with the present invention further includes protrusion pieces 51c protruded from both sides of the upper portion of the high pressure vessel 51, beams 70 fixed to the protrusion pieces 51c and the container 20 and disposed at both sides of the high pressure vessel 51 in the horizontal direction, cap rails 71 fixed along the beams 70, cap rollers 72 mounted on the cap rails 71, movable plates 73 fixed to the cap rollers 72 and provided with vertical screw holes 74, mount plates 52b protruded from both sides of the cap 52 and provided with vertical holes 52c coinciding with the vertical screw holes 74, and screws 62 connected to the vertical screw holes 74 via the vertical holes 52c.

The mobile type electron accelerator in accordance with the present invention may be designed such that the cap 52 slidably moves along the cap rails 71, as shown in FIGS. 9A to 9E, in order to overcome the limitations of the container 20 having a narrow space. Therefore, the cap rails 71 are fixed along the beams 70 fixed to the protrusion pieces 51c of the high pressure vessel 51 and the container 20 and disposed in the horizontal direction, and the mount plates 52b of the cap 52 are mounted on the movable plates 73 fixed to the cap rollers 72 and simultaneously the screws 62 are connected to the vertical holes 52c and the vertical screw holes 74 so as to allow the cap 52 to be pushed or pulled along the cap rails 71, thereby more conveniently facilitating assembly and disassembly between the high pressure vessel 51 and the cap 52.

Particularly, it is preferable that the mobile type electron accelerator in accordance with the present invention further includes screw holes 52d formed through the cap 52 toward the rim of the high pressure vessel 51, and elevation bolts 63 connected to the screw holes 52d to raise and lower the cap 52.

That is, when the elevation bolts 63 are inserted into the screw holes 52d and are rotated in the right or left direction, the elevation bolts 63 come in contact with the rim of the high pressure vessel 51 and are rotated in place, thus enabling the cap 52 to raise and lower. Under such a state, the movable plates 73 fixed to the cap rollers 72 are transferred to positions under the mount plates 52b, and thereby the cap 52 formed of the steel outer wall K3, the lead intermediate wall K2, and the steel inner wall K1 and thus having a considerably heavy weight may be rapidly, simply, and accurately assembled with and disassembled from the high pressure vessel 51 without separate equipment, such as a crane.

Further, the trailer 10 applied to the mobile type electron accelerator in accordance with the present invention may be divided into a main trailer 11 and a sub trailer 12, and the container 20 applied to the mobile type electron accelerator in accordance with the present invention may be divided into a main container 21 mounted on the main trailer 11 and a sub container 12 mounted on the sub trailer 12. Preferably, the radiation shielding room 30, the high voltage generator 50, the beam extraction device 81, the reactor 82, the beam catcher 83, the chiller 84, the power supply 87, the ozone absorber 88, the controller 89, the reaction water tub 93, and the third pump P3 may be placed in the main container 21, and the gas supply 86, the sewage tank 91, and the reaction water tank 92 may be placed in the sub container 22, thereby being capable of effectively and properly distributing the overall weight (Ton) of the mobile type electron accelerator varied according to road conditions.

Moreover, it is preferable that the main container 21 includes a self power generator 94 so as to supply power to the main container 21 in case of emergency on site where commercial power is not available. Further, it is preferable that the sub container 22 includes control equipment, such as monitoring equipment 95, so as to allow a worker to frequently check the overall process.

As apparent from the above description, the present invention provides a mobile type electron accelerator which emits electron beams accelerated by a high voltage generator to a reactor disposed in a radiation shielding room so as to prevent radiation leakage, and compensates for electron beam energy through a beam catcher disposed in the reactor so as to prevent corrosion of containers or trailers or thermal damage thereto and thus to secure lifespan of the containers or the trailers.

That is, the mobile type electron accelerator in accordance with the present invention prevents damage to the radiation shielding room and the containers due to electron beam energy of the beam extraction device through the beam catcher using cooling water supplied from a chiller.

The mobile type electron accelerator in accordance with the present invention absorbs ozone generated from the reactor in the sealed radiation shielding room and discharges the absorbed ozone to the outside, thereby preventing air pollution.

The mobile type electron accelerator in accordance with the present invention enables the high voltage generator and the beam extraction device irradiating electron beams, and the reactor to be safely placed in the containers mounted on the trailers of a vehicle mobility so as to allow a sample (for example, waste water, waste gas, and a sample to be investigated) to be tested in real time while maximally suppressing danger of environmental pollution or radiation exposure, thereby assuring rapidity, field applicability, and accuracy.

The mobile type electron accelerator in accordance with the present invention supplies a sample on site, for example, sewage from a sewage tank to the reactor, and then supplies water, obtained by reaction in the reactor by the electron beams of the beam extraction device, to a reaction water tank, thus being capable of collectively treating the sewage in the container.

The mobile type electron accelerator in accordance with the present invention is capable of automating a flow of the sewage.

Each of the radiation shielding room and a door set thereof is formed of a lead intermediate wall completely preventing radiation leakage and a steel inner wall and a steel outer wall having a high strength stacked on both surfaces of the lead intermediate wall, thereby simultaneously assuring solidity and safety.

When various cables or pipes are connected to the radiation shielding room, an inner channel, a pipe hole, and an outer channel of the radiation shielding room are formed like a labyrinthine, and thus maximally compensate for radiation leakage to the outside.

The mobile type electron accelerator in accordance with the present invention enables a sliding door to be opened and closed using a hydraulic cylinder (or an electric motor with gears) controlled by a controller so as to safely protect a worker from danger of radiation exposure from the radiation shielding room, and particularly minimizes external influence (spatial influence) through the sliding door opened and closed in the right and left direction in the sliding manner.

The mobile type electron accelerator in accordance with the present invention enables a sliding door to slidably open and close a hole formed through the ceiling of the container, thereby enabling greater ease in assembly and disassembly of the high voltage generator with and from the radiation shielding room while locating the high voltage generator above the radiation shielding room.

The mobile type electron accelerator in accordance with the present invention enables the high voltage generator to be disassembled into a high pressure vessel and a cap such that the high voltage generator is easily repaired in case of malfunction. Further, in order to completely block radiation leaked from the high voltage generator, the high voltage generator is formed of a lead intermediate wall and a steel inner wall and a steel outer wall having a high strength stacked on both surfaces of the lead intermediate wall, thereby simultaneously assuring solidity and safety.

The mobile type electron accelerator in accordance with the present invention enables the cap of the high voltage generator to simply slide so as to overcome the limitations of the container having a narrow space.

That is, cap rails are fixed along beams fixed to protrusion pieces of the high pressure vessel and the container and disposed in the horizontal direction, and mount plates of the cap are mounted on movable plates fixed to cap rollers and simultaneously screws are connected to vertical holes and the vertical screw holes so as to allow the cap to be pushed or pulled along the cap rails, thereby facilitating assembly and disassembly between the high pressure vessel and the cap.

The mobile type electron accelerator in accordance with the present invention, when elevation bolts are inserted into screw holes and are rotated in the right or left direction, causes the elevation bolts to come in contact with the rim of the high pressure vessel and to be rotated in place, thus enabling the cap to raise and lower. Under such a state, the movable plates fixed to the cap rollers are transferred to positions under the mount plates, and thereby the cap formed of the steel outer wall, the lead intermediate wall, and the steel inner wall and thus having a considerably heavy weight is rapidly, simply, and accurately assembled with and disassembled from the high pressure vessel without separate equipment, such as a crane.

The mobile type electron accelerator in accordance with the present invention may be applied to industrial fields using electron beams.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A mobile electron accelerator comprising:
   a container mounted on a trailer;
   a radiation shielding room disposed within the container and provided with a door set;
   a high voltage generator installed above the radiation shielding room to accelerate electron beams;
   a beam extraction device installed under the high voltage generator to diffuse and emit the electron beams to the inside of the radiation shielding room in a vacuum condition;
   a reactor placed below the beam extraction device;
   a beam catcher disposed in the reactor;
   a chiller to cool the high voltage generator, the beam extraction device, and the beam catcher;
   a gas supply to supply insulation gas to the high voltage generator;
   a power supply to supply power to the high voltage generator;
   an ozone absorber to absorb ozone generated from the reactor and then to discharge the ozone to the outside; and
   a controller to operate the ozone absorber while controlling the power supply to emit the electron beams from the high voltage generator to the beam extraction device and controlling the chiller to cool the high voltage generator, the beam extraction device, and the beam catcher, wherein:
   each of the radiation shielding room and the door set is formed of a steel inner wall, a lead intermediate wall, and a steel outer wall; and
   the radiation shielding room includes:
       a pipe hole formed therethrough;
       an inner channel provided on the steel inner wall and perpendicularly connected to the pipe hole; and
       an outer channel provided on the steel outer wall, perpendicularly connected to the pipe holes, and disposed in parallel with the inner channel.

2. The mobile electron accelerator according to claim 1, further comprising:
   a sewage tank to supply sewage to the reactor; and
   a reaction water tank to receive water obtained by reaction in the reactor by the electron beams of the beam extraction device.

3. The mobile electron accelerator according to claim 2, further comprising a reaction water tub to receive the water obtained by the reaction in the reactor.

4. The mobile electron accelerator according to claim 3, further comprising:
   a first pump to supply sewage from the outside to the sewage tank;
   a second pump to supply the sewage from the sewage tank to the reactor;
   a third pump to supply the water, obtained by reaction, from the reaction water tub to the reaction water tank; and
   a fourth pump to discharge the water, obtained by the reaction, from the reaction water tank to the outside.

5. The mobile electron accelerator according to claim 4, wherein:
   the trailer is divided into a main trailer and a sub trailer;
   the container is divided into a main container mounted on the main trailer and a sub container mounted on the sub trailer;
   the radiation shielding room, the high voltage generator, the beam extraction device, the reactor, the beam catcher, the chiller, the power supply, the ozone absorber, the controller, the reaction water tub, and the third pump are placed in the main container; and
   the gas supply, the sewage tank, and the reaction water tank are placed in the sub container.

6. The mobile electron accelerator according to claim 5, wherein the main container is provided with a self power generator.

7. The mobile electron accelerator according to claim 5, wherein control equipment is further placed in the sub container.

8. The mobile electron accelerator according to claim 1, wherein the door set includes:
   a sliding door to slidably open and close the radiation shielding room;
   a door rail disposed in the longitudinal direction on the steel outer wall;
   door rollers mounted on the door rail;
   door brackets to connect the door rollers to the sliding door; and
   a hydraulic cylinder (or an electric motor with gears) to reciprocate the door rollers fixed to the door brackets along the door rail under the control of the controller.

9. The mobile electron accelerator according to claim 1, further comprising:
   a hole formed through the ceiling of the container toward the high voltage generator;
   a sliding door to open and close the hole;
   ceiling rails disposed in the longitudinal direction at both sides of the hole;
   ceiling rollers mounted on the ceiling rails; and
   ceiling brackets to connect the ceiling rollers to the sliding door.

10. The mobile electron accelerator according to claim 9, wherein the high voltage generator includes:
    a high pressure vessel, in which an electric gun and primary and secondary coils are placed, provided with screw holes formed through an upper rim thereof;
    a cap provided with through holes coinciding with the screw holes and covering the high pressure vessel; and
    fixing bolts connected to the screw holes via the through holes.

11. The mobile electron accelerator according to claim 10, wherein each of the high pressure vessel and the cap is formed of a steel inner wall, a lead intermediate wall, and a steel outer wall.

12. The mobile electron accelerator according to claim 10, further comprising:

protrusion pieces protruded from both sides of an upper portion of the high pressure vessel;

beams fixed to the protrusion pieces and the container and disposed at both sides of the high pressure vessel in the horizontal direction;

cap rails fixed along the beams;

cap rollers mounted on the cap rails;

movable plates fixed to the cap rollers and provided with vertical screw holes;

mount plates protruded from both sides of the cap and provided with vertical holes coinciding with the vertical screw holes; and screws connected to the vertical screw holes via the vertical holes.

13. The mobile electron accelerator according to claim 12, further comprising:

cap screw holes formed through the cap toward the rim of the high pressure vessel; and elevation bolts coinciding with the cap screw holes to raise and lower the cap.

\* \* \* \* \*